(12) United States Patent
Li

(10) Patent No.: US 8,472,280 B2
(45) Date of Patent: Jun. 25, 2013

(54) ALTERNATE PAGE BY PAGE PROGRAMMING SCHEME

(75) Inventor: Yan Li, Milpitas, CA (US)

(73) Assignee: SanDisk Technologies Inc., Plano, TX (US)

(*) Notice: Subject to any disclaimer, the term of this patent is extended or adjusted under 35 U.S.C. 154(b) by 214 days.

(21) Appl. No.: 12/974,817

(22) Filed: Dec. 21, 2010

(65) Prior Publication Data

US 2012/0155166 A1    Jun. 21, 2012

(51) Int. Cl.
*G11C 8/00* (2006.01)

(52) U.S. Cl.
USPC .............. 365/238.5; 365/189.14; 365/189.16

(58) Field of Classification Search
USPC .............................. 365/238.5, 189.14, 189.16
See application file for complete search history.

(56) References Cited

U.S. PATENT DOCUMENTS

| | | |
|---|---|---|
| 4,357,685 A | 11/1982 | Daniele et al. |
| 4,785,427 A | 11/1988 | Young |
| 5,034,922 A | 7/1991 | Burgess |
| 5,070,032 A | 12/1991 | Yuan et al. |
| 5,093,806 A | 3/1992 | Tran |
| 5,095,344 A | 3/1992 | Harari |
| 5,172,338 A | 12/1992 | Mehrotra et al. |
| 5,245,571 A | 9/1993 | Takahashi |
| 5,313,421 A | 5/1994 | Guterman et al. |
| 5,315,541 A | 5/1994 | Harari et al. |
| 5,343,063 A | 8/1994 | Yuan et al. |
| 5,388,222 A | 2/1995 | Chisvin et al. |
| 5,418,752 A | 5/1995 | Harari et al. |
| 5,422,856 A | 6/1995 | Sasaki et al. |
| 5,509,134 A | 4/1996 | Fandrich et al. |
| 5,519,847 A | 5/1996 | Fandrich et al. |
| 5,532,962 A | 7/1996 | Auclair et al. |
| 5,537,356 A | 7/1996 | Akaogi et al. |
| 5,570,315 A | 10/1996 | Tanaka et al. |
| 5,595,924 A | 1/1997 | Yuan et al. |
| 5,661,053 A | 8/1997 | Yuan |
| 5,692,165 A | 11/1997 | Jeddeloh et al. |

(Continued)

FOREIGN PATENT DOCUMENTS

| | | |
|---|---|---|
| EP | 1134746 A2 | 9/2001 |
| EP | 1164595 A | 12/2001 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Son Dinh
(74) *Attorney, Agent, or Firm* — Davis Wright Tremaine LLP

(57) ABSTRACT

An alternate page by page scheme for the multi-state programming of data into a non-volatile memory is presented. Pages of data are written a page at a time onto word lines of the memory. After all of the pages of data are written to a first level of resolution onto one word line, the memory goes back to the adjacent word line (on which all of the pages of data have previously been written the first level of resolution) and refines the accuracy with which the data had been written on this preceding word line. This can reduce the effects on the data of capacitive coupling between the word lines.

8 Claims, 18 Drawing Sheets

U.S. PATENT DOCUMENTS

| | | | |
|---|---|---|---|
| 5,768,192 A | 6/1998 | Eitan | |
| 5,768,215 A | 6/1998 | Kwon et al. | |
| 5,774,397 A | 6/1998 | Endoh et al. | |
| 5,784,705 A | 7/1998 | Leung | |
| 5,815,444 A | 9/1998 | Ohta | |
| 5,860,082 A | 1/1999 | Smith et al. | |
| 5,862,099 A | 1/1999 | Gannage et al. | |
| 5,867,429 A | 2/1999 | Chen et al. | |
| 5,872,739 A | 2/1999 | Womack | |
| 5,893,135 A | 4/1999 | Hasbun et al. | |
| 5,903,495 A | 5/1999 | Takeuchi et al. | |
| 5,920,502 A | 7/1999 | Noda et al. | |
| 5,949,720 A | 9/1999 | Brady | |
| 5,969,986 A | 10/1999 | Wong et al. | |
| 6,011,287 A | 1/2000 | Itoh et al. | |
| 6,011,725 A | 1/2000 | Eitan | |
| 6,029,233 A | 2/2000 | Abily et al. | |
| 6,038,174 A | 3/2000 | Khan et al. | |
| 6,046,935 A | 4/2000 | Takeuchi et al. | |
| 6,046,940 A | 4/2000 | Takeuchi et al. | |
| 6,097,638 A | 8/2000 | Himeno et al. | |
| 6,128,229 A | 10/2000 | Nobukata | |
| 6,222,762 B1 | 4/2001 | Guterman et al. | |
| 6,252,803 B1 | 6/2001 | Fastow et al. | |
| 6,253,250 B1 | 6/2001 | Evans et al. | |
| 6,266,273 B1 | 7/2001 | Conley et al. | |
| 6,324,121 B2 | 11/2001 | Banks | |
| 6,349,056 B1 | 2/2002 | Conley et al. | |
| 6,356,485 B1 | 3/2002 | Proebsting | |
| 6,373,746 B1 | 4/2002 | Takeuchi et al. | |
| 6,407,953 B1 | 6/2002 | Cleeves | |
| 6,438,038 B2 | 8/2002 | Ikehashi et al. | |
| 6,456,528 B1 | 9/2002 | Chen | |
| 6,490,199 B2 | 12/2002 | Lee et al. | |
| 6,496,415 B2 | 12/2002 | Tsao | |
| 6,504,757 B1 | 1/2003 | Hollmer et al. | |
| 6,519,180 B2 | 2/2003 | Tran et al. | |
| 6,560,143 B2 | 5/2003 | Conley et al. | |
| 6,567,302 B2 | 5/2003 | Lakhani | |
| 6,650,570 B2 | 11/2003 | Tanzawa et al. | |
| 6,657,891 B1 | 12/2003 | Shibata et al. | |
| 6,684,289 B1 | 1/2004 | Gonzalez et al. | |
| 6,687,158 B2 | 2/2004 | Yano | |
| 6,700,820 B2 | 3/2004 | Elmhurst et al. | |
| 6,717,857 B2 | 4/2004 | Byeon et al. | |
| 6,731,539 B1 | 5/2004 | Wong | |
| 6,738,289 B2 | 5/2004 | Gongwer et al. | |
| 6,744,667 B2 | 6/2004 | Yamamoto et al. | |
| 6,781,877 B2 * | 8/2004 | Cernea et al. | 365/185.03 |
| 6,829,167 B2 | 12/2004 | Tu et al. | |
| 6,829,172 B2 | 12/2004 | Bloom et al. | |
| 6,829,567 B2 | 12/2004 | Michiwaki et al. | |
| 6,847,553 B2 | 1/2005 | Chen et al. | |
| 6,856,568 B1 | 2/2005 | Wong | |
| 6,859,394 B2 | 2/2005 | Matsunaga et al. | |
| 6,870,768 B2 | 3/2005 | Cernea et al. | |
| 6,925,004 B2 | 8/2005 | Shibata et al. | |
| 6,940,753 B2 | 9/2005 | Cernea | |
| 6,972,993 B2 | 12/2005 | Conley et al. | |
| 6,983,428 B2 | 1/2006 | Cernea | |
| 6,987,693 B2 | 1/2006 | Cernea et al. | |
| 6,992,936 B2 | 1/2006 | Tsujikawa et al. | |
| 6,999,344 B2 | 2/2006 | Hosono et al. | |
| 7,009,878 B2 | 3/2006 | Hosono et al. | |
| 7,012,835 B2 | 3/2006 | Gonzalez et al. | |
| 7,023,736 B2 | 4/2006 | Cernea et al. | |
| 7,038,946 B2 | 5/2006 | Hosono et al. | |
| 7,046,568 B2 | 5/2006 | Cernea | |
| 7,057,939 B2 | 6/2006 | Li et al. | |
| 7,073,103 B2 | 7/2006 | Gongwer et al. | |
| 7,120,051 B2 | 10/2006 | Gorobets | |
| 7,158,421 B2 | 1/2007 | Li et al. | |
| 7,170,782 B2 | 1/2007 | Conley et al. | |
| 7,177,197 B2 | 2/2007 | Cernea | |
| 7,187,585 B2 | 3/2007 | Li et al. | |
| 7,196,931 B2 | 3/2007 | Cernea et al. | |
| 7,206,230 B2 | 4/2007 | Li et al. | |
| 7,224,614 B1 | 5/2007 | Chan | |
| 7,245,528 B2 | 7/2007 | Shibata et al. | |
| 7,251,160 B2 | 7/2007 | Li et al. | |
| 7,301,805 B2 | 11/2007 | Gorobets et al. | |
| 7,301,808 B2 | 11/2007 | Li et al. | |
| 7,301,816 B2 | 11/2007 | Li et al. | |
| 7,301,839 B2 | 11/2007 | Li et al. | |
| 7,321,510 B2 | 1/2008 | Li et al. | |
| 7,352,635 B2 | 4/2008 | Cernea | |
| 7,376,011 B2 | 5/2008 | Conley et al. | |
| 7,447,078 B2 | 11/2008 | Li | |
| 7,463,521 B2 | 12/2008 | Li | |
| 7,480,181 B2 | 1/2009 | Li | |
| 7,619,922 B2 | 11/2009 | Li et al. | |
| 7,679,965 B2 * | 3/2010 | Lasser | 365/185.24 |
| 2001/0006477 A1 | 7/2001 | Banks | |
| 2001/0006479 A1 | 7/2001 | Ikehashi et al. | |
| 2001/0040826 A1 | 11/2001 | Lakhani | |
| 2002/0036925 A1 | 3/2002 | Tanzawa et al. | |
| 2002/0039322 A1 | 4/2002 | Tran et al. | |
| 2002/0099904 A1 | 7/2002 | Conley | |
| 2002/0118574 A1 | 8/2002 | Gongwer et al. | |
| 2002/0126528 A1 | 9/2002 | Conley et al. | |
| 2002/0126531 A1 | 9/2002 | Hosono et al. | |
| 2002/0126532 A1 | 9/2002 | Matsunaga et al. | |
| 2003/0072192 A1 | 4/2003 | Bloom et al. | |
| 2003/0117850 A1 | 6/2003 | Yano | |
| 2003/0123295 A1 | 7/2003 | Elmhurst et al. | |
| 2003/0137888 A1 | 7/2003 | Chen et al. | |
| 2003/0156455 A1 | 8/2003 | Nakamura et al. | |
| 2003/0174555 A1 | 9/2003 | Conley et al. | |
| 2004/0057285 A1 | 3/2004 | Cernea et al. | |
| 2004/0057287 A1 | 3/2004 | Cernea et al. | |
| 2004/0057318 A1 | 3/2004 | Cernea et al. | |
| 2004/0060031 A1 | 3/2004 | Cernea | |
| 2004/0109357 A1 | 6/2004 | Cernea et al. | |
| 2004/0109362 A1 | 6/2004 | Gongwer et al. | |
| 2004/0160829 A1 | 8/2004 | Tsujikawa et al. | |
| 2004/0210729 A1 | 10/2004 | Horii et al. | |
| 2004/0237000 A1 | 11/2004 | Keays | |
| 2004/0240269 A1 | 12/2004 | Cernea | |
| 2005/0047217 A1 | 3/2005 | Shibata et al. | |
| 2005/0157560 A1 | 7/2005 | Hosono et al. | |
| 2005/0162913 A1 | 7/2005 | Chen | |
| 2005/0169057 A1 | 8/2005 | Shibata et al. | |
| 2005/0169082 A1 | 8/2005 | Cernea | |
| 2005/0210184 A1 | 9/2005 | Chen et al. | |
| 2005/0257120 A1 | 11/2005 | Gorobets et al. | |
| 2006/0031593 A1 | 2/2006 | Sinclair | |
| 2006/0050562 A1 | 3/2006 | Cernea et al. | |
| 2006/0126390 A1 | 6/2006 | Gorobets et al. | |
| 2006/0126394 A1 | 6/2006 | Li | |
| 2006/0136687 A1 | 6/2006 | Conley et al. | |
| 2006/0140007 A1 | 6/2006 | Cernea et al. | |
| 2006/0221692 A1 | 10/2006 | Chen | |
| 2006/0221696 A1 | 10/2006 | Li | |
| 2006/0221697 A1 | 10/2006 | Li | |
| 2006/0221704 A1 | 10/2006 | Li et al. | |
| 2006/0221714 A1 | 10/2006 | Li | |
| 2006/0233010 A1 | 10/2006 | Li | |
| 2006/0233021 A1 | 10/2006 | Lin et al. | |
| 2006/0233022 A1 | 10/2006 | Li | |
| 2006/0233023 A1 | 10/2006 | Lin et al. | |
| 2006/0233026 A1 | 10/2006 | Li | |
| 2006/0239080 A1 | 10/2006 | Li | |
| 2007/0002626 A1 | 1/2007 | Li | |
| 2007/0103982 A1 | 5/2007 | Li et al. | |
| 2007/0109846 A1 | 5/2007 | Li et al. | |
| 2007/0109867 A1 | 5/2007 | Li et al. | |
| 2007/0297226 A1 | 12/2007 | Mokhlesi | |
| 2009/0067253 A1 | 3/2009 | Li | |
| 2009/0237998 A1 | 9/2009 | Li et al. | |
| 2009/0237999 A1 | 9/2009 | Li | |
| 2010/0061151 A1 | 3/2010 | Miwa et al. | |
| 2010/0172179 A1 | 7/2010 | Gorobets et al. | |
| 2010/0172180 A1 | 7/2010 | Paley et al. | |
| 2010/0174845 A1 | 7/2010 | Gorobets et al. | |
| 2010/0174846 A1 | 7/2010 | Paley et al. | |
| 2010/0174847 A1 | 7/2010 | Paley et al. | |

FOREIGN PATENT DOCUMENTS

| EP | 1280161 A1 | 1/2003 |
|---|---|---|
| JP | 11003290 | 1/1999 |
| JP | 2001-325796 A | 11/2001 |
| JP | 2004-206833 A | 7/2004 |
| JP | 2004-326866 A | 11/2004 |
| WO | WO 2006/107654 | 10/2006 |
| WO | WO 2010044993 | 4/2010 |

OTHER PUBLICATIONS

Imainiya et al., "A 125-mm$^2$ 1-Gb NAND Flash Memory with 10/Mbyte/s Program Speed," IEEE Journal of Solid State Circuits, vol. 37, No. 11, Nov. 2002, pp, 1493-1501.

Lee et al., "High-Performance 1-Gb NAND Flash Memory with 0.12-µTechnology," Journal of Solid-State Circuits, Nov. 2002, vol. 37, No. 11, pp. 1502-1509.

Nakamura et al., "A Novel Sense Amplifier for Flexible Voltage Operation NAND Flash Memories," 1995 Symposium on VLSI Circuits Digest of Technical Papers, Jun. 8-10, 1995, pp. 71-72.

Srisa-an et al., "Performance Enhancements to the Active Memory System," 2002 IEEE International Conference on Computer Design: VLSI in Computers and Processors, Sep. 16-18, 2002, pp. 249-256.

U.S. Appl. No. 61/142,620 entitled "Non-Volatile Memory and Method With Improved Block Management System," filed Jan. 5, 2009, 144 pages.

U.S. Appl. No. 12/642,584 entitled "Maintaining Updates of Multi-Level Non-Volatile Memory in Binary Non-Volatile Memory," filed Dec. 18, 2009, 76 pages.

U.S. Appl. No. 12/642,740 entitled "Non-Volatile Memory and Method with Atomic Program Sequence and Write Abort Detection," filed Dec. 18, 2009, 60 pages.

U.S. Appl. No. 12/642,649 entitled "Data Transfer Flows for On-Chip Folding," filed Dec. 18, 2009, 73 pages.

Notification of Transmittal of the International Search Report and the Written Opinion of the International Searching Authority, or the Declaration for International Application No. PCT/US2011/063584 dated Apr. 2, 2012, 14 pages.

\* cited by examiner

Programming into Four States Represented by a 2-bit Code

ALTERNATE PAGE BY PAGE PROGRAMMING SCHEME

BACKGROUND

This application relates to the programming of re-programmable non-volatile memory systems, such as semiconductor flash memory, and, more specifically, to the order in which pages of data are written word lines of the memory.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together. In a multi-state memory, several pages of data will be written onto each word line. There are various algorithms for how these pages of data can be written and on how the multiple pages on a word line are encoded. The different schemes have various relative advantages and disadvantages with respect to one another and there is an ongoing need for improving the accuracy and performance of write operations.

SUMMARY OF THE INVENTION

According to a general aspect of the invention, a method of writing multiple pages of data into a non-volatile memory is presented. The non-volatile memory has multi-state memory cells formed along a plurality of word lines, so that the memory can store N pages of data on a word line so that each memory cell stores N bits of data, where N is an integer greater than one. The method includes writing N pages of data on a page by page basis into a first word line and writing N pages of data on a page by page into a second word line. The second word line is adjacent to the first word line and at least one of the N pages of data is written into the second word line is written subsequent to writing all of the N pages of data into the first word line. The method also includes subsequently performing a programming operation on the first word line to refine the accuracy with which the N pages of data written into the first word line have been written.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

FIG. 1 to FIG. 7 provide example memory systems in which the various aspects of the present invention may be implemented or illustrated.

FIG. 8 to FIG. 11 illustrate one memory and block architecture for implementing the various aspects of the present invention.

Figure 1:
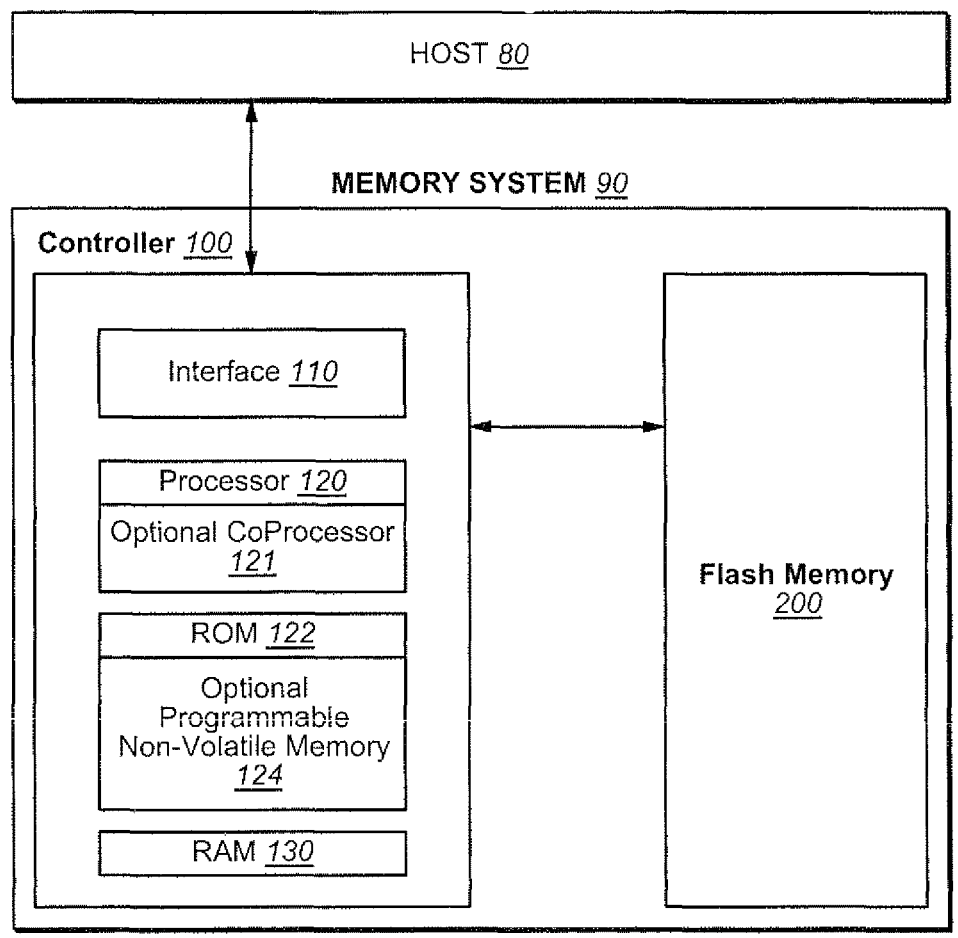
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
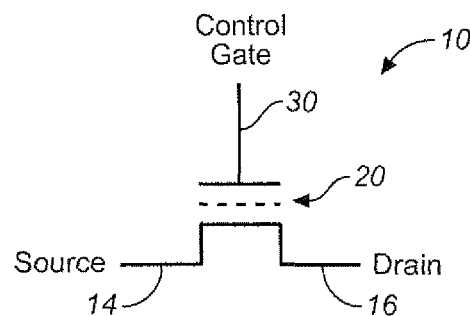
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
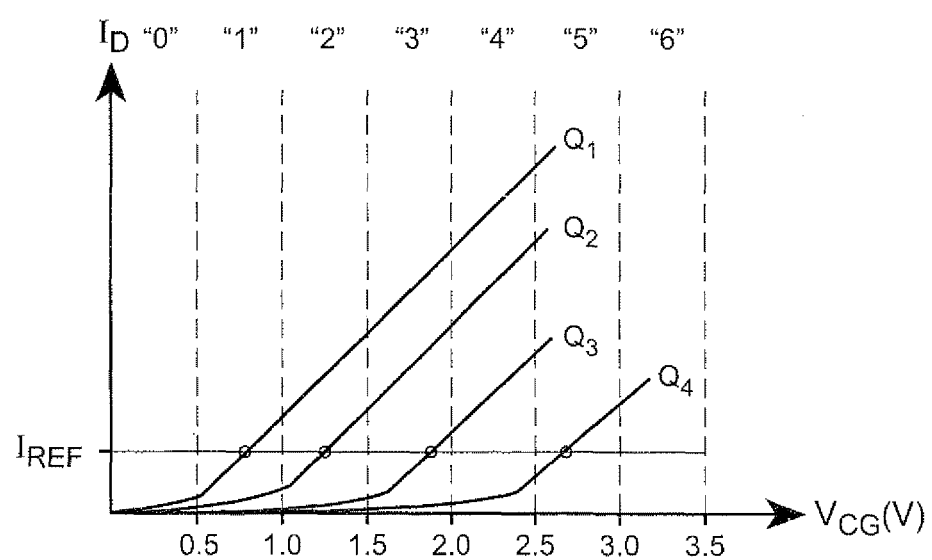
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
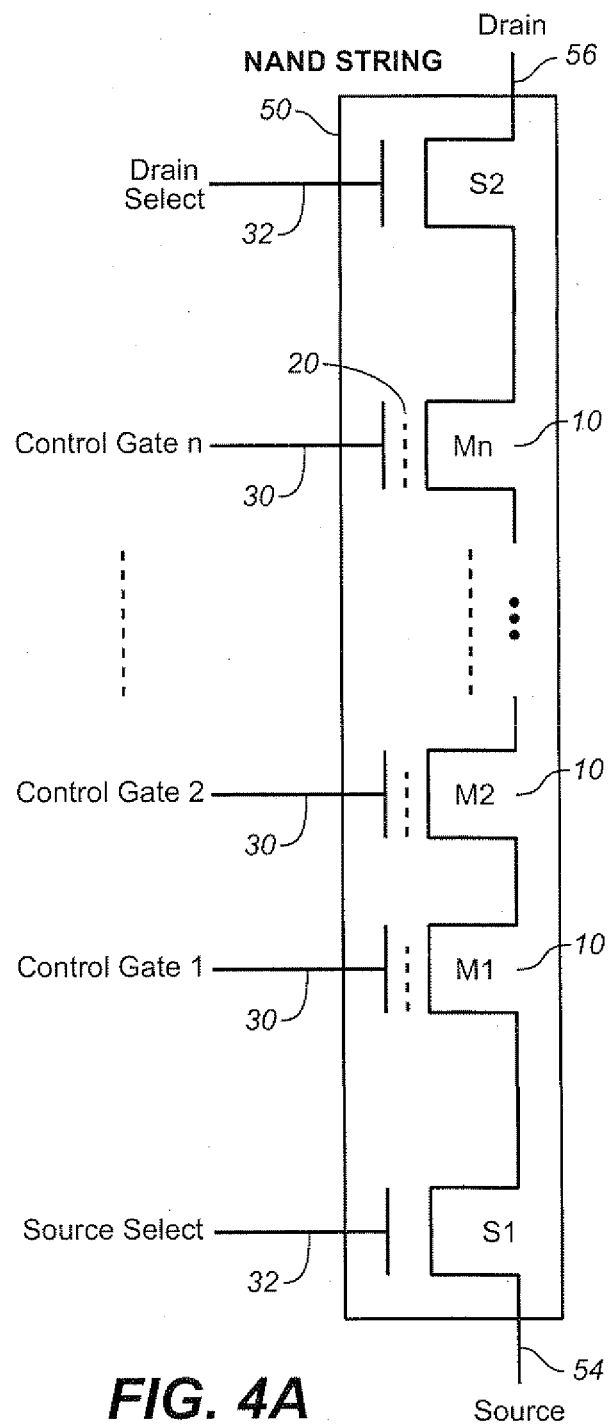
FIG. 4A illustrates schematically a string of memory cells organized into an NAND string.

FIG. 4A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
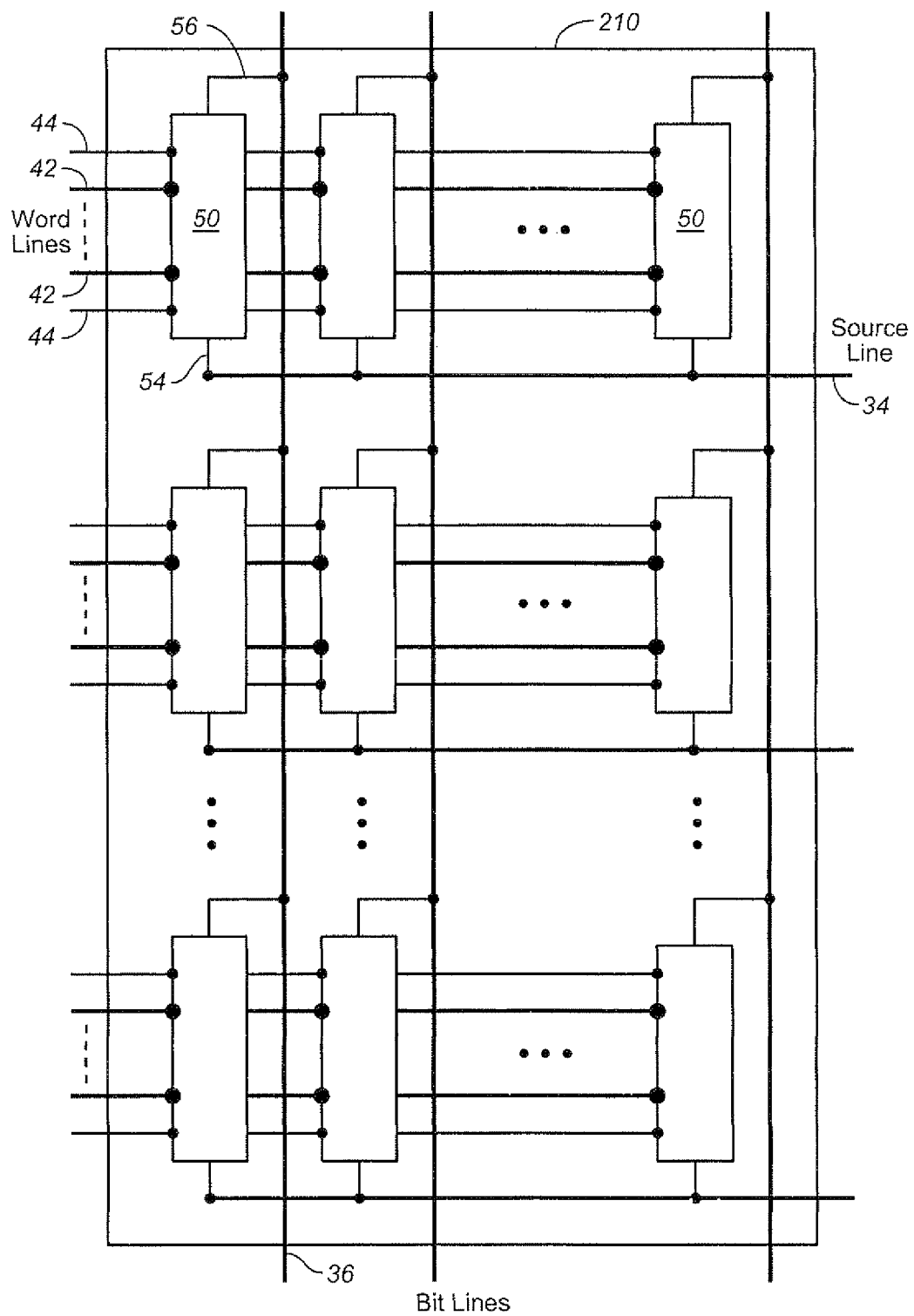
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
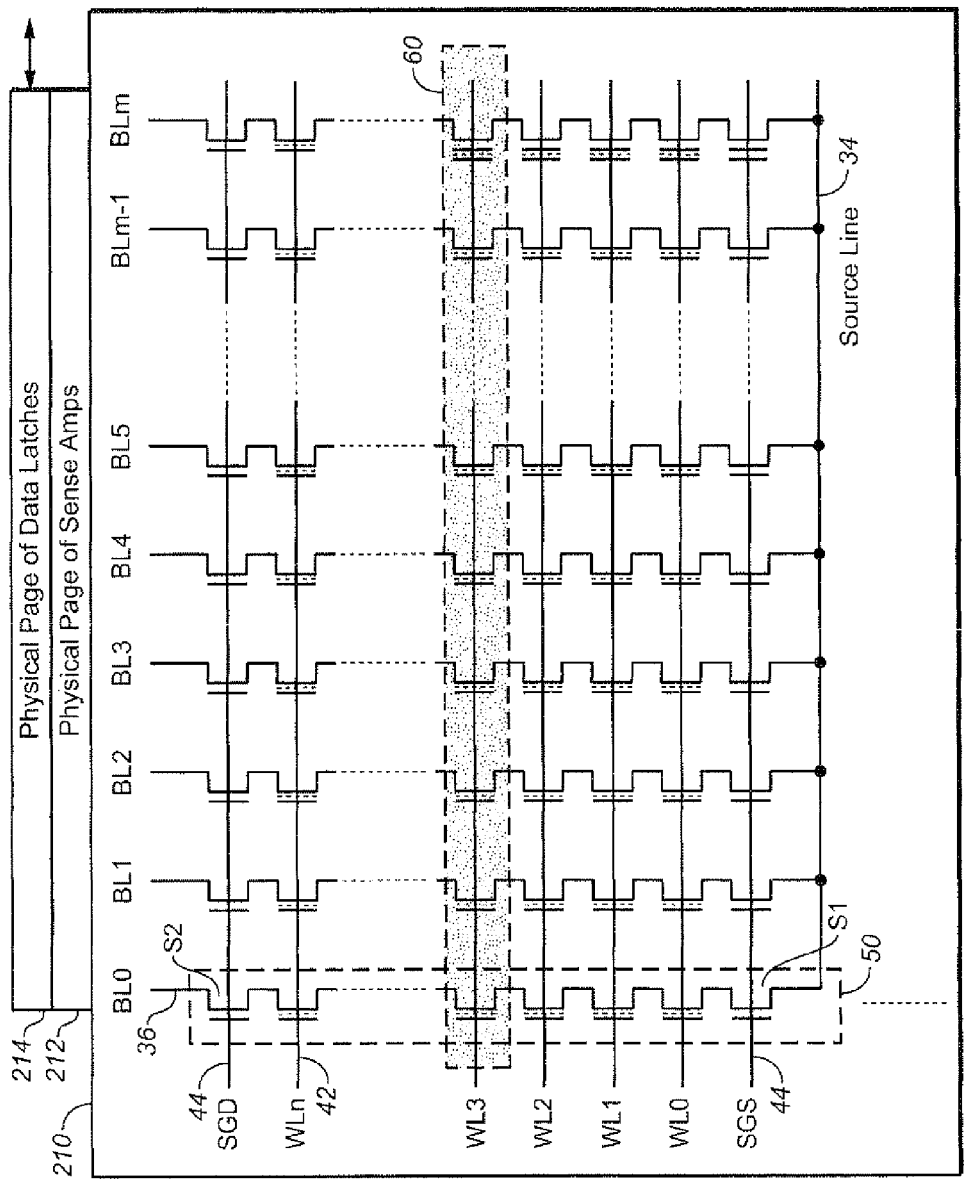
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into, a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
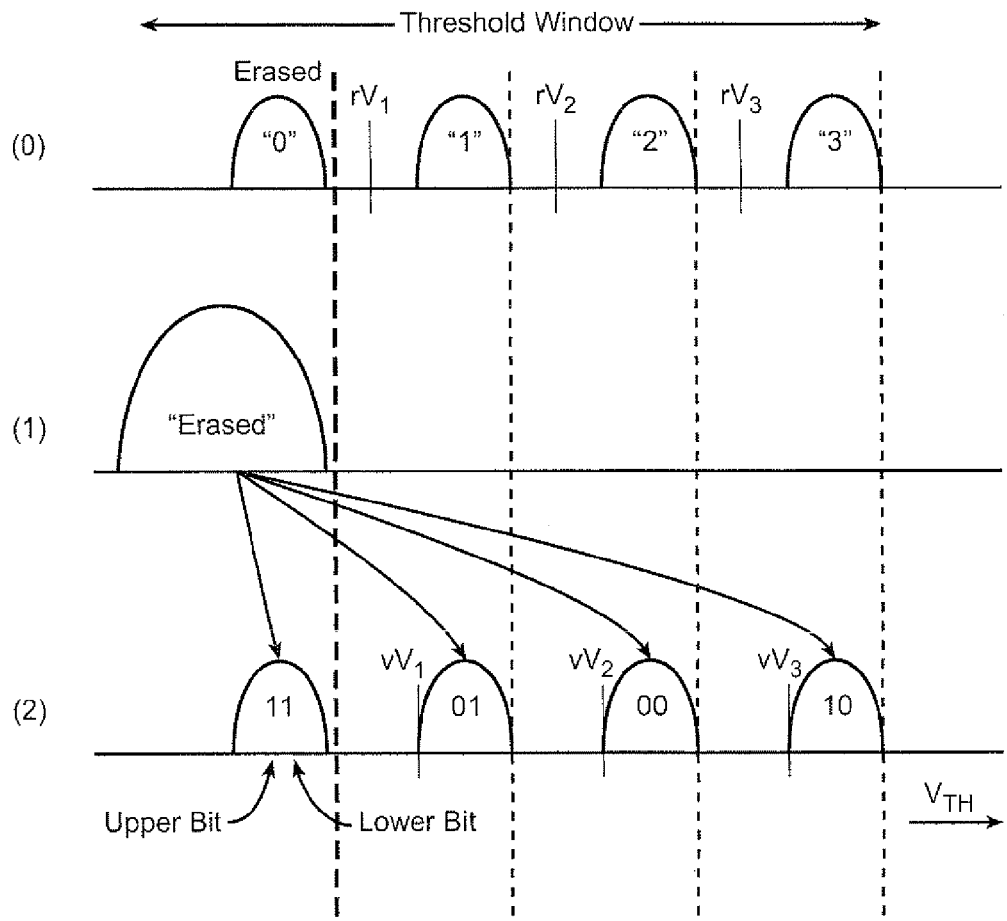
FIG. 6(0)-6(2) illustrate an example of programming a population of 4-state memory cells.

FIG. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
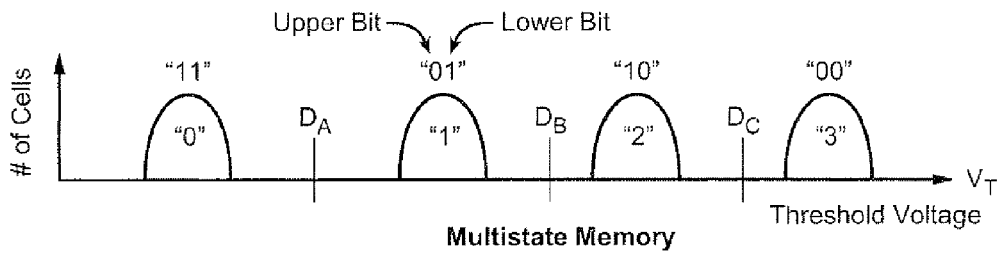
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
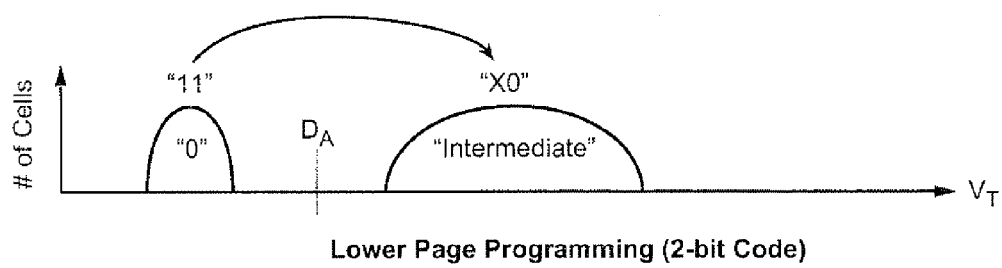

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
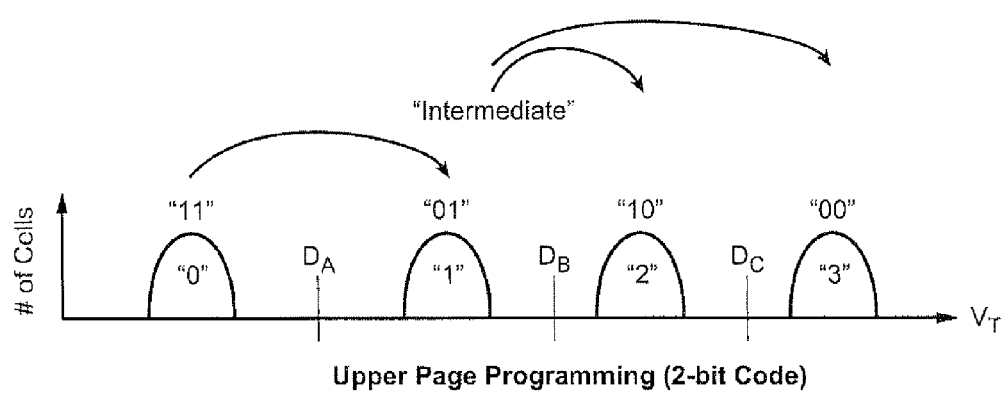

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
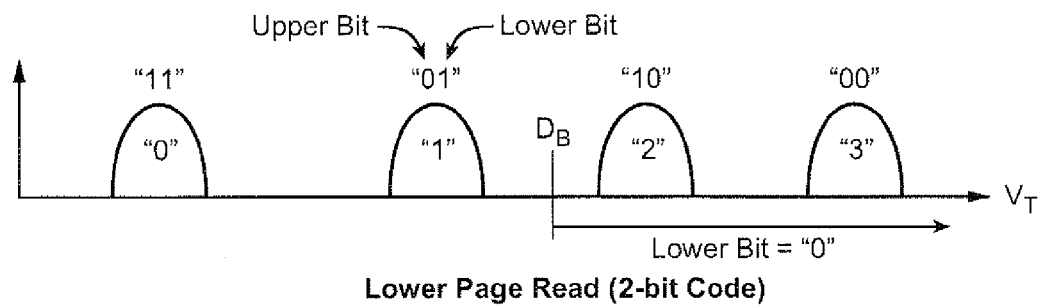

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
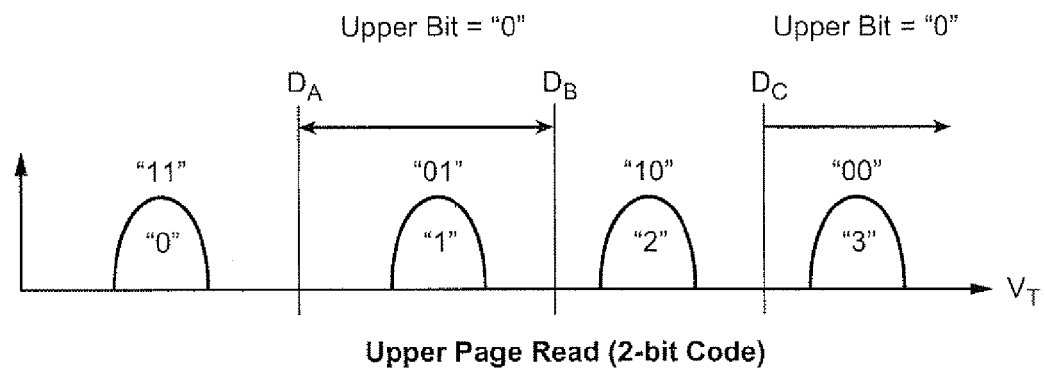

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Foggy-Fine Programming

Figure 7F:
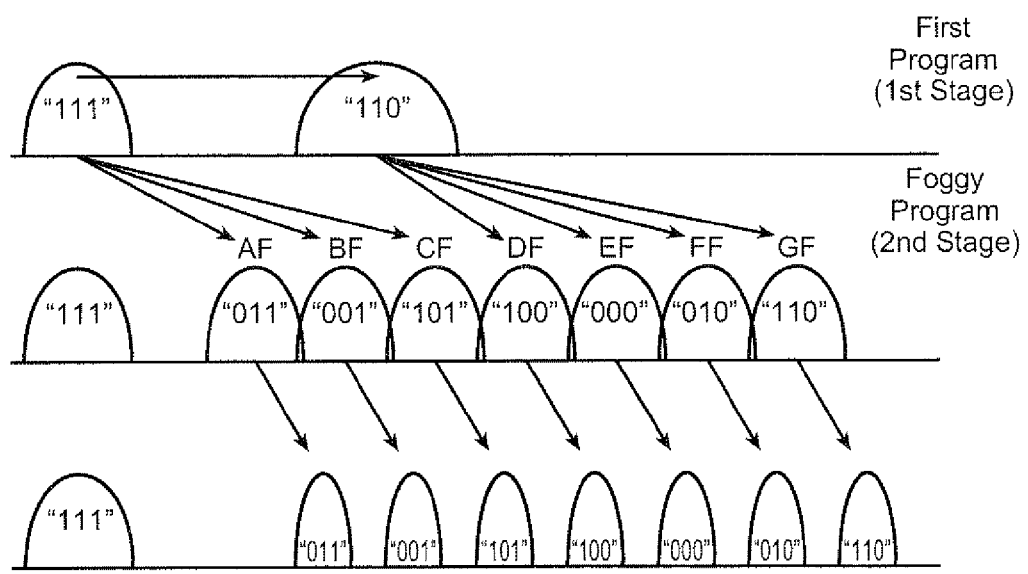
FIG. 7F illustrates a foggy-fine programming for an 8-state memory encoded with a given 3-bit code.

Another variation on multi-state programming employs a foggy-fine algorithm, as is illustrated in FIG. 7F for a 3-bit memory example. As shown there, this another multi-phase programming operation. A first programming operation is performed as shown in the top line, followed the foggy programming stage. The foggy phase is a full 3-bit programming operation from the first phase using all eight of the final states. At the end of the foggy, though, the data in these states is not yet fully resolved into well defined distributions for each of the 8 states (hence, the "foggy" name) and is not readily extractable.

As each cell is, however, programmed to near its eventual target state, the sort of neighboring cell to cell couplings, or "Yupin" effect, described in U.S. Pat. No. 6,870,768 are presenting most of their effect. Because of this, when the fine program phase (shown on the bottom line) is executed, these couplings have largely been factored in to this final phase so the cell distributions are more accurately resolved to their target ranges. More detail on these subjects is given in U.S. Pat. Nos. 6,870,768 and 6,657,891 and in the U.S. patent application Ser. No. 12/642,740 entitled "Atomic Program Sequence and Write Abort Detection" by Gorobets et al. filed Dec. 18, 2009, and which presents a "diagonal" first-foggy-fine method, and references further cited therein.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
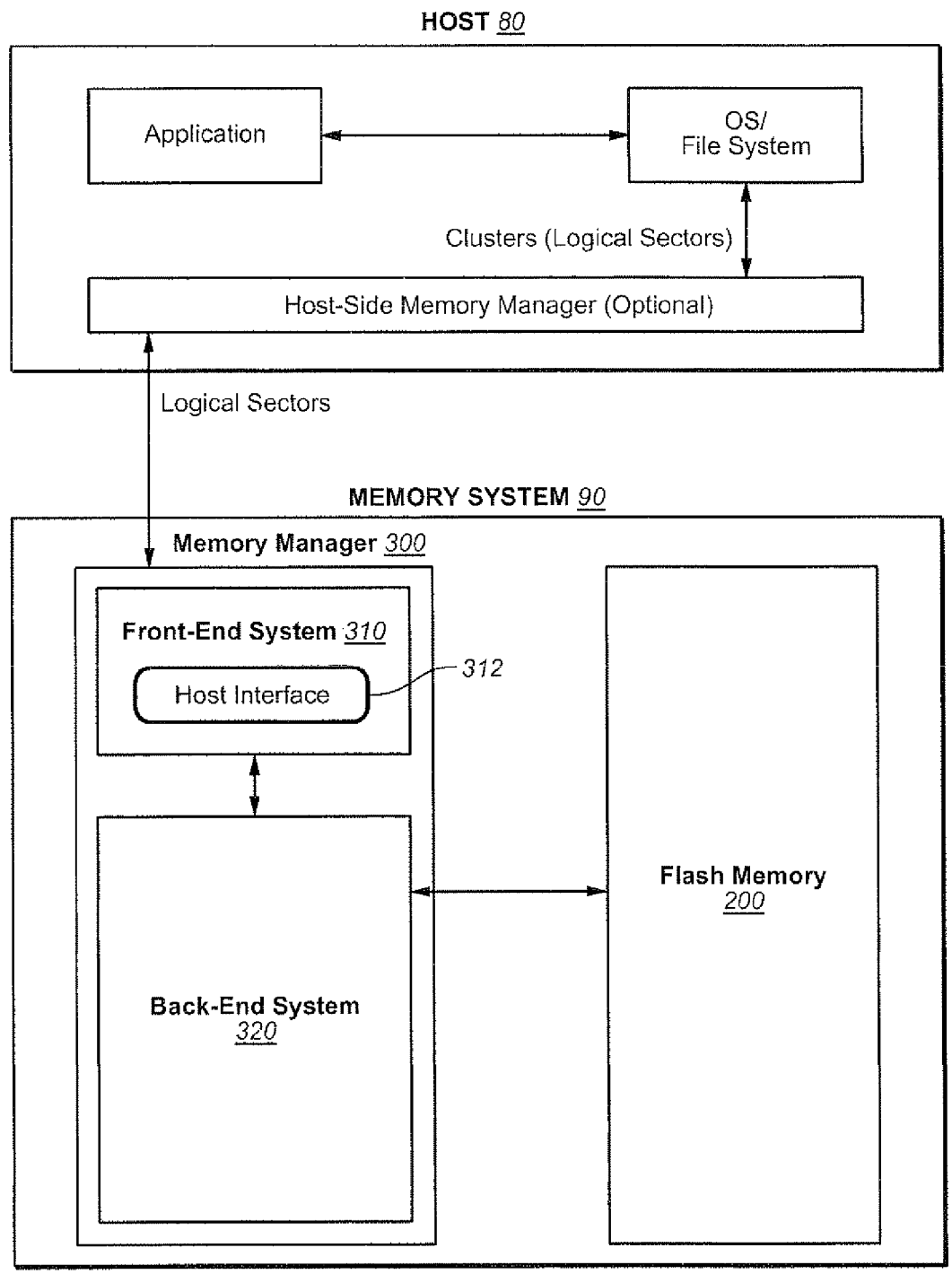
FIG. 8 illustrates the memory being managed by a memory manager with is a software component that resides in the controller.

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
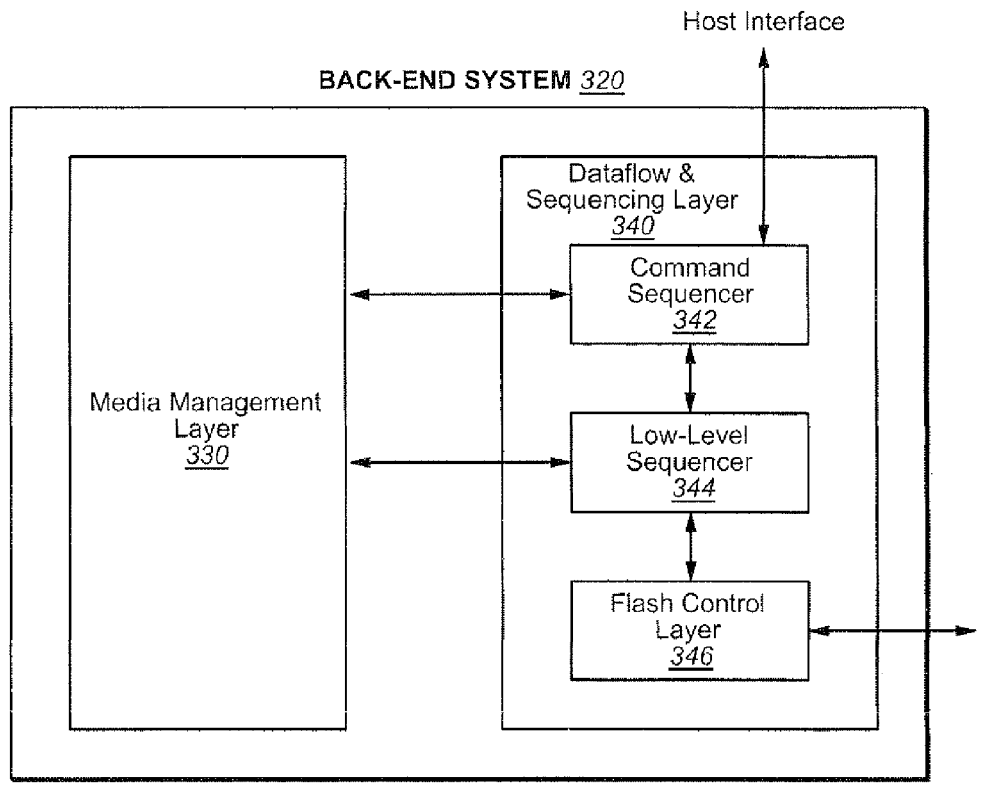
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
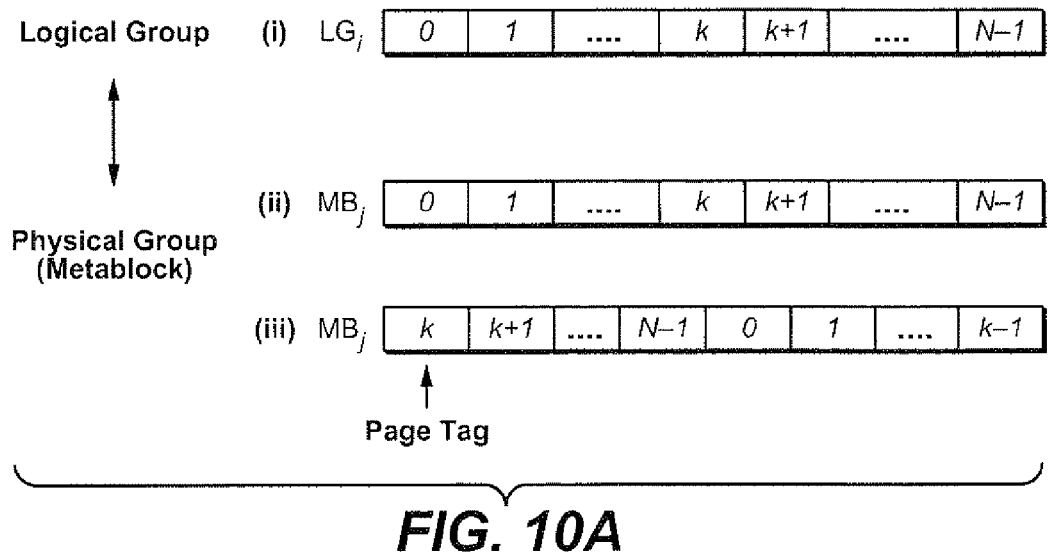
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
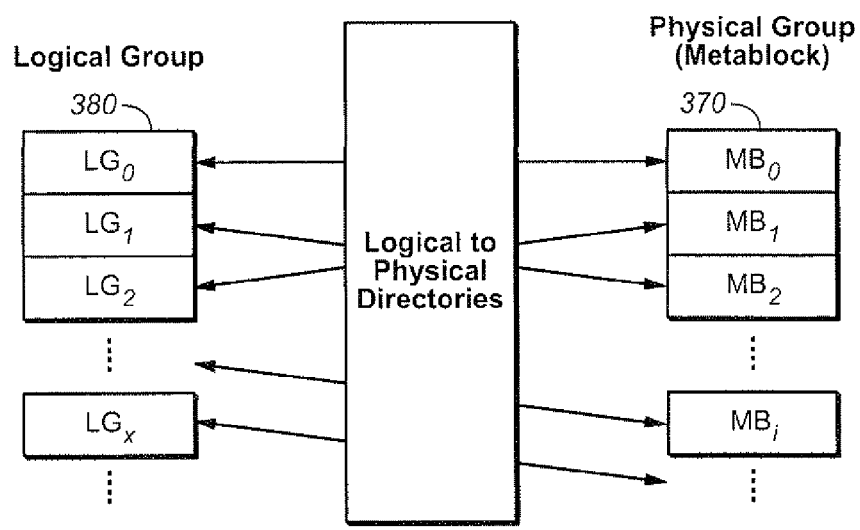
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Memory Partitioned into Main and Binary Cache Portions

A number of memory system arrangements where the non-volatile memory includes both binary and multi-level sections will now be described. In a first of these, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store less bits of data in each cell than that of the main memory. Both the cache portion and the main memory portion operate under a block management system for which cache operation is optimized. A more detailed presentation of this material is developed in the following U.S. patent application or provisional application Ser. Nos. 12/348,819; 12/348,825; 12/348,891; 12/348,895; 12/348,899; and 61/142,620, all filed on Jan. 5, 2009

In the preferred embodiment, individual cells in the cache portion are each configured to store one bit of data while the cells in the main memory portion each stores more than one bit of data. The cache portion then operates as a binary cache with faster and more robust write and read performances.

In the preferred embodiment, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembly in sequential order to the blocks in the main memory portion.

In one aspect of the invention, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Figure 11:
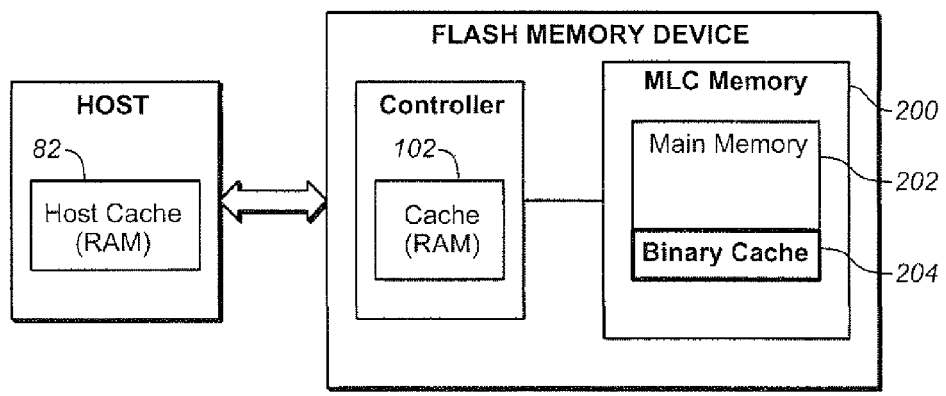
FIG. 11 illustrates a host operating with the flash memory device through a series of caches at different levels of the system.

FIG. 11 illustrates a host operating with the flash memory device through a series of caches at different levels of the system. A Cache is high-speed storage for temporarily storing data being passed between a high-speed and a slower-speed component of the system. Typically high-speed volatile RAM are employed as cache as in a host cache 82 and/or in a controller cache 102 of the memory controller. The non-volatile memory 200 is partitioned into two portions. The first portion 202 has the memory cells operating as a main memory for user data in either MLC or binary mode. The second portion 204 has the memory cells operating as a cache in a binary mode. Thus, the memory 200 is partitioned into a main memory 202 and a binary cache. More detail on the use of binary cache is given in U.S. patent application Ser. Nos. 12/642,584, 12/642,740, 12/642,611, and 12/642,649, all filed on Dec. 18, 2009, and references further incorporated therein.

Alternate Page by Page Programming

Several different algorithms and ways of encoding data have been discussed above, particularly with respect to FIGS.

6 and 7A-7F. The use of page by page writing of data, where data is sequentially programmed with data one page at a time lends itself to a flexible user interface, but suffers from the effects of the capacitive coupling between word lines, or "Yupin" effect, also discussed above. This is also true for the full-sequence program, as the entire data content of one word line is only written in after the entire content of the previous word line is already written.

The sort of foggy-fine algorithm discussed above with respect to FIG. 7F can reduce the Yupin effect, but, at the end of the foggy phase, this leave the data content stored in way where the differing data states are not well defined and the data content cannot be extracted. To execute the foggy fine write algorithm to the final state requires the caching of data in a way that leads to quite a bit of cache usage. When non-volatile memory is used for this caching, such as in the sort of binary cache structure just discussed, this can lead to significant wear on the binary cache that, given that a memory may undergo a large number of writes, can lead to wearing out of the binary cache, even given binary's more generous operating margins.

An alternate page by page programming scheme is presented in this section to deal with these limitations. A 2-bit per cell example is presented first, followed by a 3-bit per cell example.

2-Bit Per Cell Example

Figure 12:
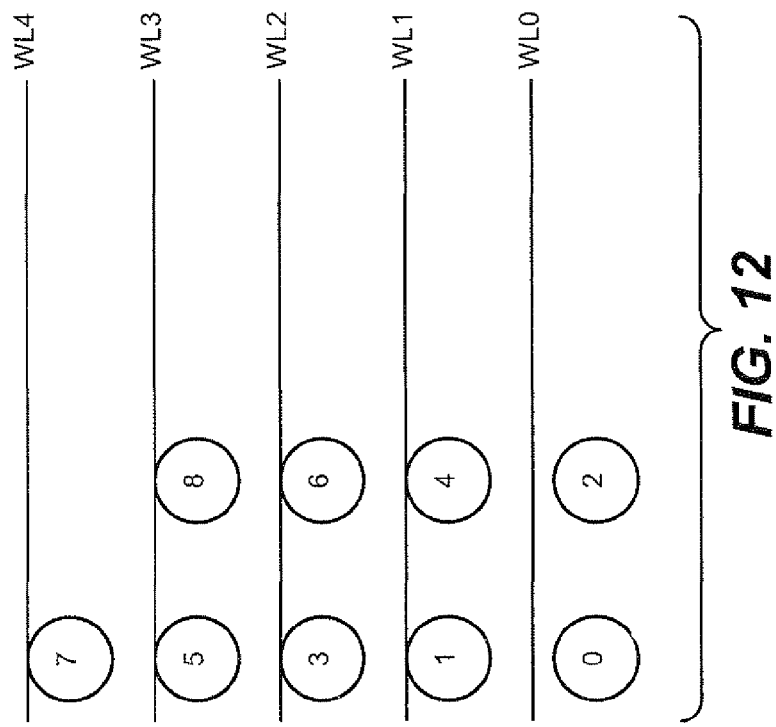
FIG. 12 shows one word line order for a page by page data write for a typical 2-bit per cell embodiment.

Returning to FIGS. 7B and 7C above, these show the typical lower page, upper page programming of 2-bits per cell. To reduce amount of programming error due to the effects of word-line to word-line capacitive coupling, or Yupin effect, rather than write in the lower page of data (FIG. 7B) into the word-line followed by writing the next page of data in the sequence as the upper page (FIG. 7C) on the same word-line, a sequence of pages of data is written into the word-lines is to using an alternating order such as is illustrated in FIG. 12. FIG. 12 shows several word lines of an array (WL0-4) and the order in which a sequence of data pages (the circled numbers 0-7) are written into these word lines, where the number on the left is the lower page and the number on the right the upper. As shown there, after a page of data is written in as a lower page (for example, data page 3 on WL2), the system writes the next page of data in as the upper page in the preceding word line (here data page 4 on WL1), after which the memory jumps to the following word line and writes a lower page (here data page 5 on WL3), before it returns to write the upper page (data page 6). The process goes back and forth between the word lines in this way for the data set, where more detail on this word line order is presented in U.S. Pat. Nos. and patent publication numbers 7,619,922; 7,352,635; 7,463,521; US-2009-0237998-A1; and US-2009-0237999-A1.

This sort of page by page 2-bit programming as shown in FIGS. 7B and 7C with the order of FIG. 12 is useful since it allows for a fairly flexible user interface. Also, since when programming in an upper page of data (for example, page 6 on WL2) the adjacent word line on one side already (here WL1) has both data pages written and the word line on the other side (WL 3) has the lower page written in, the Yupin effect will be diminished to some extent. However, when the upper page on, here, WL 3 is written, this will affect the data previously written on WL 2. Consequently, there can still be a significant amount of Yupin effect. Also, depending on how much this affects the data after it is stored, accurately reading the data may require the system to take into consideration the data content on adjacent word lines by use of a "look-ahead" read process, such as is described in U.S. Pat. No. 7,187,585.

Figure 13:
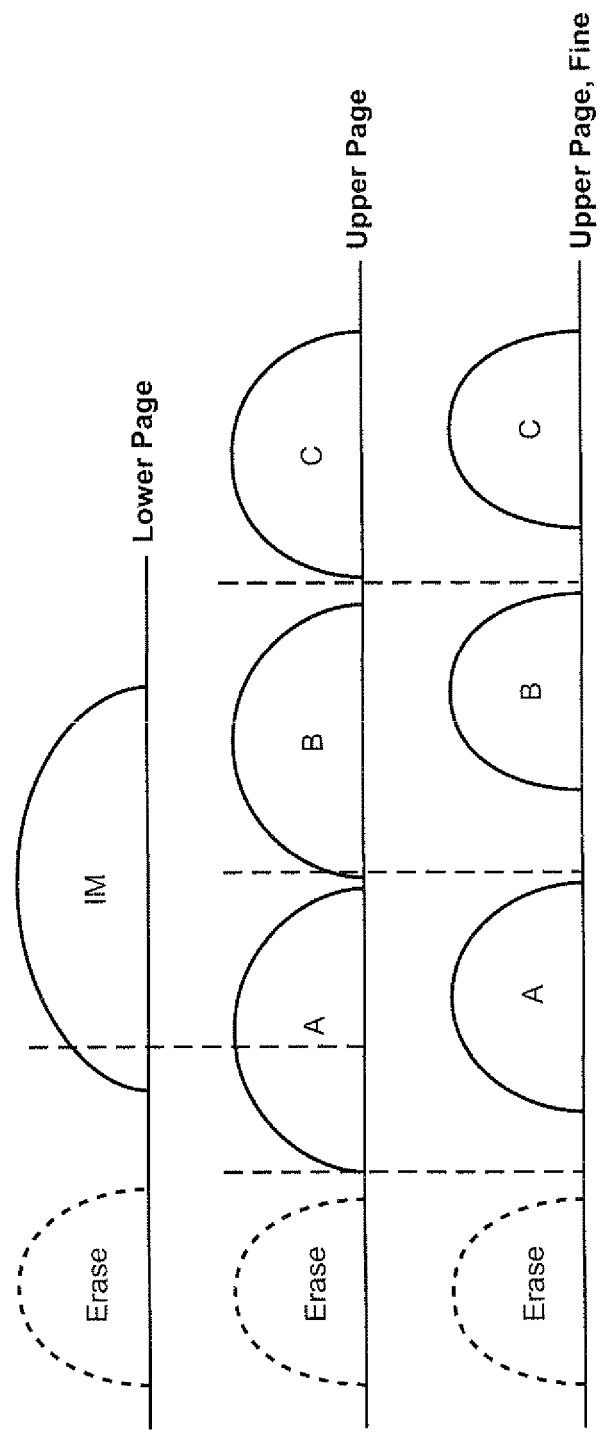
FIG. 13 illustrates the programming and state distributions for a 2-bit per cell alternate page by page write operation.

The exemplary embodiment will still use a page by page programming algorithm, but after finishing programming of the upper page of data on word line WLn, the memory goes back and performs a fine programming operation on word line WL(n−1). The distributions are shown in FIG. 13. The top line shows the lower page of data programmed in, with a cell either still in the erased state or the intermediate state IM, and this corresponds to situation of FIG. 7B. The upper page is then programmed in, where the states are shown here in the notation A, B, C for the non-erase state, as shown in the middle line. This situation is similar to what is shown in FIG. 7C, except that the distributions for the non-erase states are not as tight. In some respect, this is similar to a 2-bit version of the foggy-fine arrangement of FIG. 7F, except that, unlike in that case, the distributions are well enough defined that the data content can still be extracted. Consequently, even without the caching of any data content, which leads to cache wear, the data content of both pages of data could be extracted if the process was halted at this point, rather for an actual read back of the data or for the later fine programming phase.

The bottom line of FIG. 13 shows the result of the fine phase of re-programming to refine the upper page. This can be done by reading back the data on the word line WLm, in the exemplary embodiment with a look ahead read for better accuracy, whether this is done just after finishing writing the upper page in word line WL(m+1) or after an intervening operation or other interrupt. The programming order for pages 0-8 of data is shown in FIG. 14.

Figure 14:
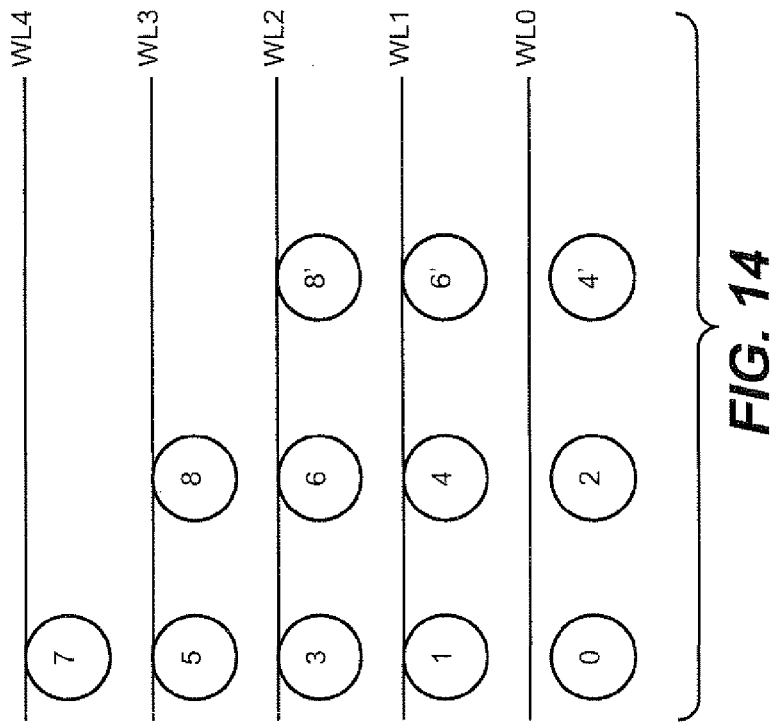
FIG. 14 shows the exemplary programming order of data pages into word lines for the alternate page by page programming scheme of FIG. 13.

In FIG. 14 the fine programming operations added to the page by page process are indicated by the prime: 4' refines the upper page (2) on WL0 and is done after the upper page 4 is written on WL1 and before the lower page 5 is written on WL3; 6' refines the upper page on WL1 (4) and is done after the upper page 6 is written on WL2 and before the lower page 7 is written on WL4; and so on. The extra programming step of the alternate page by page write process foes not add any data content, but refines what is already there. As the upper page is already written on WLn before the process comes back and refines the upper page on WL(n−1), the Yupin effect is reduced. When the upper page on WLn is then itself refined, this will have only a relatively small residual Yupin effect left.

The reduction in Yupin effects means that the look ahead read process need not be used for read out the data, making the data storage more compatible with dynamic read. (The look ahead read may still be used, though, to read the data content on a word line prior to the fine programming phase to improve its accuracy and the initial upper page programming is not as well defined.) The final distribution of states after the fine write will also leave more margin for data retention.

3-Bit Per Cell Embodiment

Figure 15:
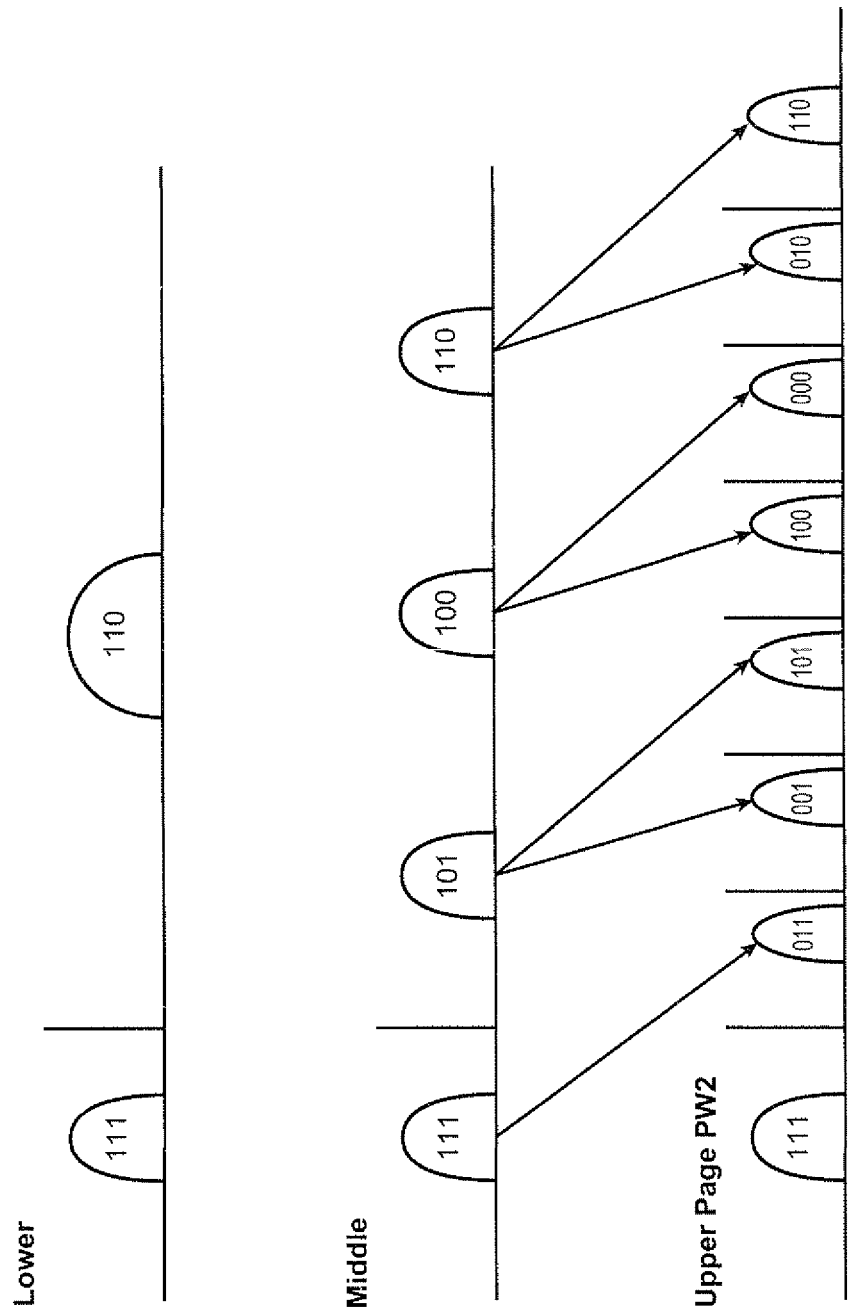
FIG. 15 illustrates the programming and state distributions for a typical 3-bit per cell page by page write operation.
Figure 16:
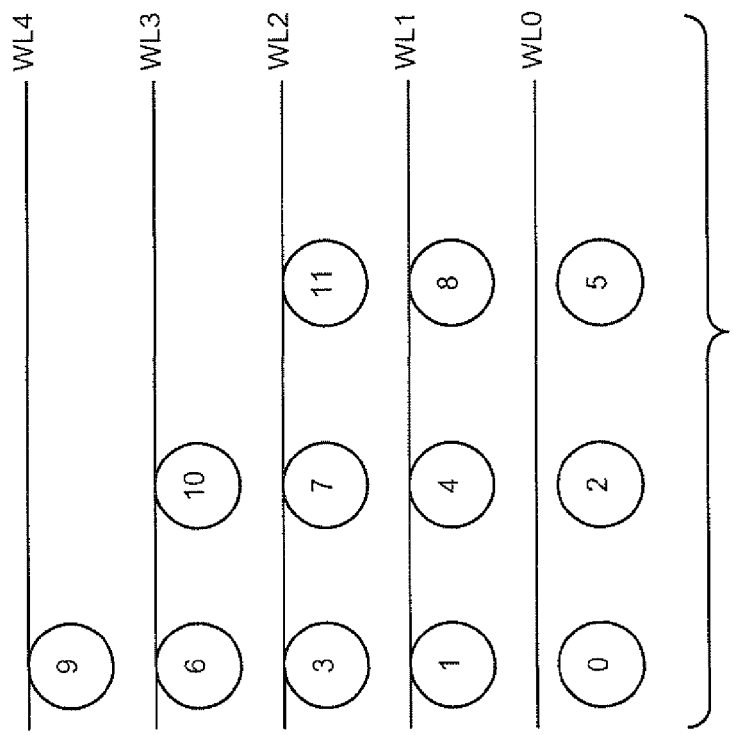
FIG. 16 shows one word line order for a page by page data write for a typical 3-bit per cell embodiment.

Before discussing the alternate page by page programming scheme in the 3-bit per cell case, it would be useful to review the usual page by page programming arrangement. FIG. 15 illustrate how 3 pages on stored onto a word line in this typical page by page process. The top and middle line are for the first two pages written into the word line and are the counterpart of FIGS. 7B and 7C, except the middle line now corresponds to the second, or middle, page written on the word line. The bottom line shown how the 4 distributions are then resolved into the full 8 states when the third, or top, page is written in. FIG. 16 shows a conventional page order for programming a series of data pages (0-11 are shown) on word lines WL0-4. As the data is written in a page at a time, there is not the need for caching of additional data, as is the case for the foggy-fine algorithm discussed below. The page by page arrangement also allows for a flexible user interface. It has the drawbacks of a relatively large residual Yupin effect and will typically need the use of a look ahead read process.

The amount of residual Yupin effect can be reduced by going to foggy fine type of algorithm discussed above with respect to FIG. 7F. After the "first", binary write phase, all three pages are written onto the word line, but in a "foggy" write operation. Although this foggy write relies on all three pages of data, the data content of the word line cannot be extracted at this point. Only after the completion of the fine phase is the data readable. Consequently, although the amount of Yupin effect may be less, the foggy fine algorithm requires a lot of cache usage, which can lead to endurance issues in the sort of binary cache arrangement discussed above.

Figure 18:
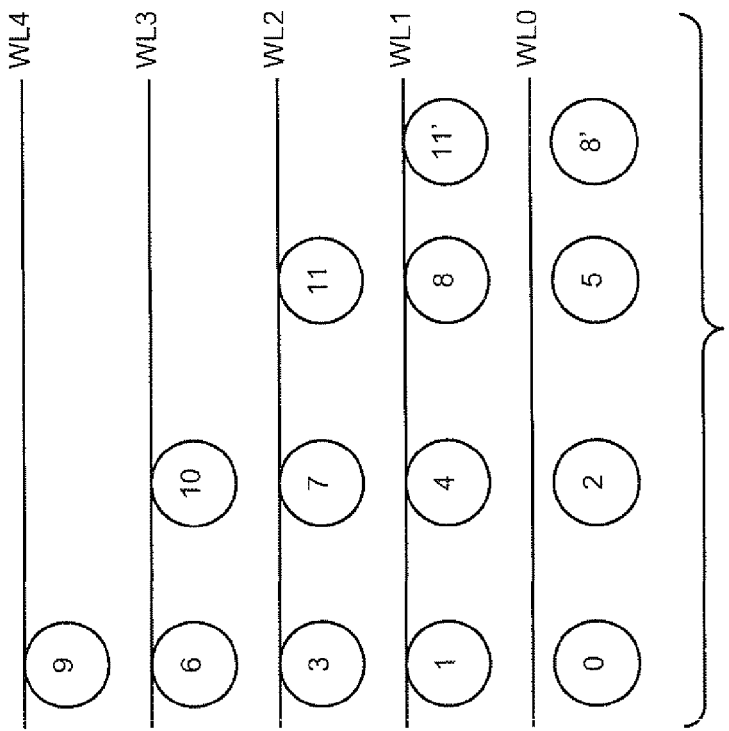
FIG. 18 shows the exemplary programming order of data pages into word lines for the alternate page by page programming scheme of FIG. 17.
Figure 17:
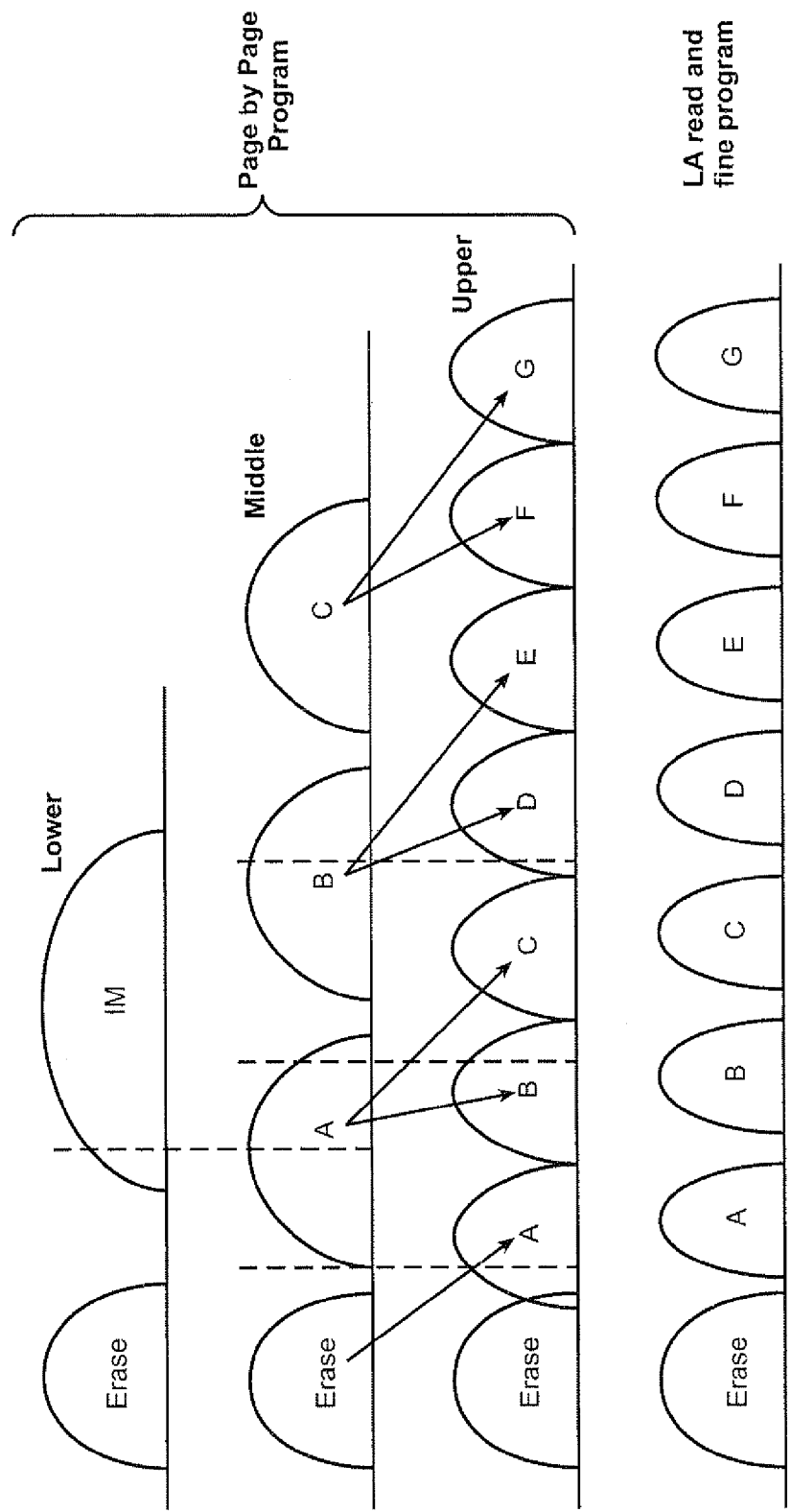
FIG. 17 illustrates the programming and state distributions for a 3-bit per cell alternate page by page write operation.

The alternate page by page programming operation for the 3-bit per cell case is illustrated with respect to FIG. 17 and FIG. 18. The top three lines of FIG. 17 shows the distribution of states are the lower, middle and upper pages of data are written into a word line. This is much the same as in FIG. 15, but with the non-erase states labeled as A-G rather than any specific encoding, except that the states are less well resolved after the writing of the upper page. In addition the difference that the data is written a page at a time, this differs from the foggy state in that the data can be read. Although fairly coarsely written, after the upper page has been written, the data content can still extracted. Consequently, the data can be read back off the page for the subsequent fine programming with the need to cache data.

The bottom line of FIG. 17 shows the distribution of states where the data is read back and the fine program operation is performed to fine the distribution. To more accurately determine that data content on the word line for the fine programming operation, the read can use a look ahead type of read. To tighten up the distribution, the fine phase can use, for example, shifted verify levels. Additionally, or alternately, the fine programming operation could use smaller step size or other changes for improved accuracy. In the exemplary embodiment, after finishing the upper page program on a word line WLn, the system then goes back to word line WL(n−1), reads in data content, and does the fine data write to refine the distribution on page WL(n−1). FIG. 18 shows the order in the exemplary embodiment.

In FIG. 18 the circled number 0-11 are a sequence of data pages in the order they are written. Those on the far left correspond to lower pages, the next column (2, 4, 7, 10) the middle pages, and then, left of center, the upper pages. The fine programming operations added to the page by page process are indicated by the prime: 8' refines the upper page (page 8) on WL0 and is done after the upper page 8 is written on WL1 and before the lower page 9 is written on WL4; 11' refines the upper page on WL1 (page 11) and is done after the upper page 11 is written on WL2 and so on. In this way when the fine programming operation is performed on, for example, WL1, as the upper page already in WL2 there will be little Yupin effect on the WL1 data. Also, as the data can be read back off of WL1 to use as the target state data for the fine phase, this eliminates the needed caching of data specify to the foggy-fine procedure. When the upper page data on WL2 is subsequently refined (for example, in what would be a 14', not shown), there will only be a relatively small residual Yupin effect. (With respect to the upper page data, such as shown on WL2 which has yet to have the fine phase, this can left as is until subsequent data arrive and programming continues, or could have just have a fine phase added on, particularly if it known or likely there will not be any further for the block, such as for the last word line in a block.)

Figure 19:
FIG. 19 shows some waveforms for an alternate page by page write operation.

FIG. 19 illustrates some timing waveforms that can be used with the alternate page by page scheme. The waveform for writing both the lower and middle pages onto a word line WLn are respectively shown at top and middle and can be as in the standard page by page arrangement. For the upper page, though, the initial upper page write on WLn is then followed by a read (here a look ahead read) of WL(n−1) and the subsequent fine write of WLn. For consecutive write of multiple pages, this allows for smooth series of sequential writes. However, in the multi-level write true busy (time used for internal memory operations) time, if needed or desired the programming can be suspended to other operations, such as a program to binary cache or a data read (from either the binary or multi-state memory portions).

The described alternate page by page programming scheme consequently allows for the writing of data with reduced Yupin effect and the reading back of data without resort to a look ahead-type mechanism, while also not having the caching requirements, and consequent binary cache wear, of a foggy-fine algorithm. As the initial programming is done on a page by page basis, the memory is flexible in the system's page management. If advantageous, the data tightening of the fine program can be done in the background. Similarly, as the fine phase can be suspended during its execution or before initiated, other operations (such as a page by page read or a lower page program) can be inserted between the upper page write on one word line and the start of the fine programming phase of the previous word line, which can then be subsequently resumed. The fine program can also be aborted in the middle of its execution, with process picked up later, with the system just remembering the page and then performing a look ahead type read, if needed, before resuming.

Although the alternate page by page scheme has been described for 2-bit per cell and 3-bit per cell embodiments, but readily extends to other numbers of states. For higher numbers of bits, the usual page by page sequence is similarly extended so that after programming the top-most page of data into a word line WLn, the system goes back to word line WL(n−1), reads out its data content (where a look ahead mechanism well be even more preferred as the number of stored levels in a cell increases), and the execute the fine program on WL(n−1). As this alternate page by page technique adds the extra fine phase, it would appear that there may a performance penalty. In practice, this is not the case as it will typically provide comparable or even better performance relative to the foggy-fine arrangement, while still substantively reducing the amount of Yupin effects and also without the cache wear found in the foggy-fine process. Also when compared to the more traditional page by page case, as the top page is not initially written with as much accuracy, this write will typically take less time, offsetting what is then used in the fine phase. The alternate page by page can then be optimized as to the various parameters (pulse duration, step size, and so on) of the constituent write operations to optimize the process.

Conclusion

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are It is claimed:

1. A method of writing multiple pages of data into a non-volatile memory having multi-state memory cells formed along a plurality of word lines, wherein the memory can store N pages of data on a word line so that each memory cell stores N bits of data, where N is an integer greater than one, the method comprising:
   writing N pages of data on a page by page basis into a first word line;
   writing N pages of data on a page by page into a second word line, where the second word line is adjacent to the first word line and wherein at least one of the N pages of data is written into the second word line is written subsequent to writing all of the N pages of data into the first word line;
   subsequently performing a programming operation on the first word line to refine the accuracy with which the N pages of data written into the first word line have been written; and
   subsequent to writing the N pages of data into the second word and prior to performing said programming operation, reading the data written into the first word line, wherein the subsequent programming operation refines the accuracy with which the N pages of data written into the first word line based upon the value of the N pages of data as read therefrom.

2. The method of claim 1, wherein said reading the data written into the first word line is performed using data content of the second word line.

3. A method of writing multiple pages of data into a non-volatile memory having multi-state memory cells formed along along a plurality of word lines, wherein the memory can store N pages of data on a word line so that each memory cell stores N bits of data, where N is an integer greater than one, the method comprising:
   writing N pages of data on a page by page basis into a first word line;
   writing N pages of data on a page by page into a second word line, where the second word line is adjacent to the first word line and wherein at least one of the N pages of data is written into the second word line is written subsequent to writing all of the N pages of data into the first word line; and
   subsequently performing a programming operation on the first word line to refine the accuracy with which the N pages of data written into the first word line have been written, wherein the programming operation to refine the accuracy is performed using different verify levels than the writing of the N pages of data into the first word line.

4. A method of writing multiple pages of data into a non-volatile memory having multi-state memory cells formed along a plurality of word lines, wherein the memory can store N pages of data on a word line so that each memory cell stores N bits of data, where N is an integer greater than one, the method comprising:
   writing N pages of data on a page by page basis into a first word line;
   writing N pages of data on a page by page into a second word line, where the second word line is adjacent to the first word line and wherein at least one of the N pages of data is written into the second word line is written subsequent to writing all of the N pages of data into the first word line; and
   subsequently performing a programming operation on the first word line to refine the accuracy with which the N pages of data written into the first word line have been written,
   wherein N equals two and writing N pages of data into the first and second word lines comprises:
   writing a lower page of data into the first word line;
   subsequently writing a lower page of data into the second word line;
   subsequently writing an upper page of data into the first word line; and
   subsequently writing a upper page of data into the second word line.

5. The method of claim 4, further comprising:
   subsequent to writing the upper page of data into the first word line and prior to writing the upper page of data into the second word line, writing a lower page of data into a third word line, where the third word line is adjacent to the second word line on the opposite side from the first word line.

6. A method of writing multiple pages of data into a non-volatile memory having multi-state memory cells formed along a plurality of word lines, wherein the memory can store N pages of data on a word line so that each memory cell stores N bits of data, where N is an integer greater than one, the method comprising:
   writing N pages of data on a page by page basis into a first word line;
   writing N pages of data on a page by page into a second word line, where the second word line is adjacent to the first word line and wherein at least one of the N pages of data is written into the second word line is written subsequent to writing all of the N pages of data into the first word line; and
   subsequently performing a programming operation on the first word line to refine the accuracy with which the N pages of data written into the first word line have been written,
   wherein N equals three and wherein writing N pages of data into the first and second word lines and the writing one or more pages of data into the third word line comprises:
   writing a lower page of data into the first word line;
   subsequently writing a lower page of data into the second word line;
   subsequently writing an middle page of data into the first word line;
   subsequently writing an middle page of data into the second word line;
   subsequently writing a upper page of data into the first word line; and
   subsequently writing a upper page of data into the second word line.

7. The method of claim 6, wherein the method further comprises:
   subsequent to writing the middle page of data into the first word line and prior to writing the middle page of data into the second word line, writing a lower page of data into a third word line, where the third word line is adjacent to the second word line on the opposite side from the first word line;
   subsequent to writing the upper page of data into the first word line and prior to writing the upper page of data into the second word line, writing a lower page of data into a fourth word line and writing a middle page of data into the third word line, where the fourth word line is adjacent to the third word line on the opposite side from the second word line.

8. The method of claim 1, further comprising:
subsequent to writing the N pages of data into the second word and prior to performing said programming operation, performing one or more additional memory operations.

\* \* \* \* \*